United States Patent

Munoz-Bustamante et al.

[19]

[11] Patent Number: 6,158,118

[45] Date of Patent: Dec. 12, 2000

[54] METHOD AND APPARATUS FOR ALIGNING SURFACE MOUNTED OPTOELECTRIC SEMICONDUCTOR DEVICES ON A PRINTED CIRCUIT BOARD

[75] Inventors: Carlos Munoz-Bustamante, Durham; Daniel McConnell, Raleigh, both of N.C.

[73] Assignee: International Business Machines Corporation

[21] Appl. No.: 09/282,393

[22] Filed: Mar. 31, 1999

[51] Int. Cl.[7] ................................................ H05K 3/30
[52] U.S. Cl. ............................. 29/833; 29/832; 29/740; 359/163
[58] Field of Search .......................... 29/832, 833, 834, 29/740, 759; 385/14; 359/159, 163

[56] References Cited

U.S. PATENT DOCUMENTS

| | | | |
|---|---|---|---|
| 4,720,634 | 1/1988 | D'Auria et al. | 250/551 |
| 4,732,446 | 3/1988 | Gipson et al. | 350/96.1 |
| 4,838,630 | 6/1989 | Jannson et al. | 350/3.7 |
| 5,093,879 | 3/1992 | Bregman et al. | 385/93 |
| 5,093,890 | 3/1992 | Bregman et al. | 385/146 |
| 5,096,279 | 3/1992 | Hornbeck et al. | 359/230 |
| 5,283,447 | 2/1994 | Olbright et al. | 257/85 |
| 5,404,373 | 4/1995 | Cheng | 372/50 |
| 5,422,901 | 6/1995 | Lebby et al. | 372/36 |
| 5,469,442 | 11/1995 | Seligmann et al. | 370/110.4 |
| 5,552,924 | 9/1996 | Tregilgas | 359/224 |
| 5,572,540 | 11/1996 | Cheng | 372/50 |
| 5,673,284 | 9/1997 | Congdon et al. | 372/50 |
| 5,708,280 | 1/1998 | Lebby et al. | 257/88 |
| 5,789,733 | 8/1998 | Jackmowicz et al. | 235/492 |
| 5,875,047 | 2/1999 | Abe et al. | 359/152 |
| 6,038,048 | 3/2000 | Harris et al. | 359/159 |

*Primary Examiner*—Lee Young
*Attorney, Agent, or Firm*—George E. Grosser; Andrew Dillon

[57] ABSTRACT

A method and apparatus for aligning surface mounted optoelectric devices on a printed circuit board are disclosed. An optical transmitter and an optical receiver are added to the surface mounted optoelectric device. Also, a fiber optic cable is embedded within a printed circuit board. The length of the fiber optic cable is at least equivalent to a distance between the optical transmitter and the optical receiver placed on the surface mounted optoelectric device. An orientation of the surface mounted optoelectric device is aligned on the printed circuit board such that an optical signal transmitting from the optical transmitter can be received by the optical receiver via the fiber optic cable.

12 Claims, 5 Drawing Sheets

METHOD AND APPARATUS FOR ALIGNING SURFACE MOUNTED OPTOELECTRIC SEMICONDUCTOR DEVICES ON A PRINTED CIRCUIT BOARD

BACKGROUND OF THE INVENTION

1. Technical Field

The present invention relates to printed circuit boards in general, and in particular to a method and apparatus for aligning surface mounted devices on a printed circuit board. Still more particularly, the present invention relates to a method and apparatus for aligning surface mounted semiconductor optoelectric devices on a printed circuit board within an optoelectric computer system.

2. Description of the Prior Art

Within most computer systems, a bus (or a group of buses) is typically the primary vehicle by which communication among electronic components takes place. Although there are different types of buses, in its most basic form, each bus is simply a series of electrical wires interconnecting various electronic components within a computer system. The electrical transmission characteristics of a bus are defined by the material properties of the bus, the physical geometry of the components, the clock speed of the signals, and the noise within the bus. Thus, both the limitations in materials and the limitations in electronic components contribute to the electrical transmission characteristics of a bus.

As computer systems become more complex, there is a continuing need to drive signals within a bus at a faster clock rate while at the same time minimizing power, noise, and electromagnetic interference. Most if not all of these requirements are satisfied by optoelectric computer systems. An optoelectric computer system is a computer system in which digital data signals are transmitted in both electrically conductive buses and optical buses (or pathways). Such computer systems may, for example, utilize semiconductor devices that have vertical cavity surface emitting lasers (VCSELs) serving as transducers for optoelectric exchange. One such semiconductor device that is now in commercial use is the HFBR-5303 VCSEL transceiver manufactured by Hewlett Packard™.

Because the diameter of the optical pathways located on the printed circuit board of an optoelectric computer system are generally very small, it is important to ensure that surface mounted optoelectric devices, as they are mounted on the printed circuit board during the assembly process, are sufficiently aligned with the optical pathways to permit optical signal communication. In view of such, the present disclosure provides a method and apparatus for aligning surface mounted optoelectric devices on a printed circuit board such that reliable operation can be assured.

SUMMARY OF THE INVENTION

In accordance with a preferred method of the present invention, an optical transmitter and an optical receiver are added within a surface mounted optoelectric device. Also, a fiber optic cable is embedded within a printed circuit board. The length of the fiber optic cable is at least equivalent to a distance between the optical transmitter and the optical receiver placed on the surface mounted optoelectric device. An orientation of the surface mounted optoelectric device is aligned on the printed circuit board such that an optical signal transmitting from the optical transmitter can be received by the optical receiver via the fiber optic cable.

All objects, features, and advantages of the present invention will become apparent in the following detailed written description.

DESCRIPTION OF THE DRAWINGS

The invention itself, as well as a preferred mode of use, further objects, and advantages thereof, will best be understood by reference to the following detailed description of an illustrative embodiment when read in conjunction with the accompanying drawings, wherein.

DESCRIPTION OF A PREFERRED EMBODIMENT

Figure 1:
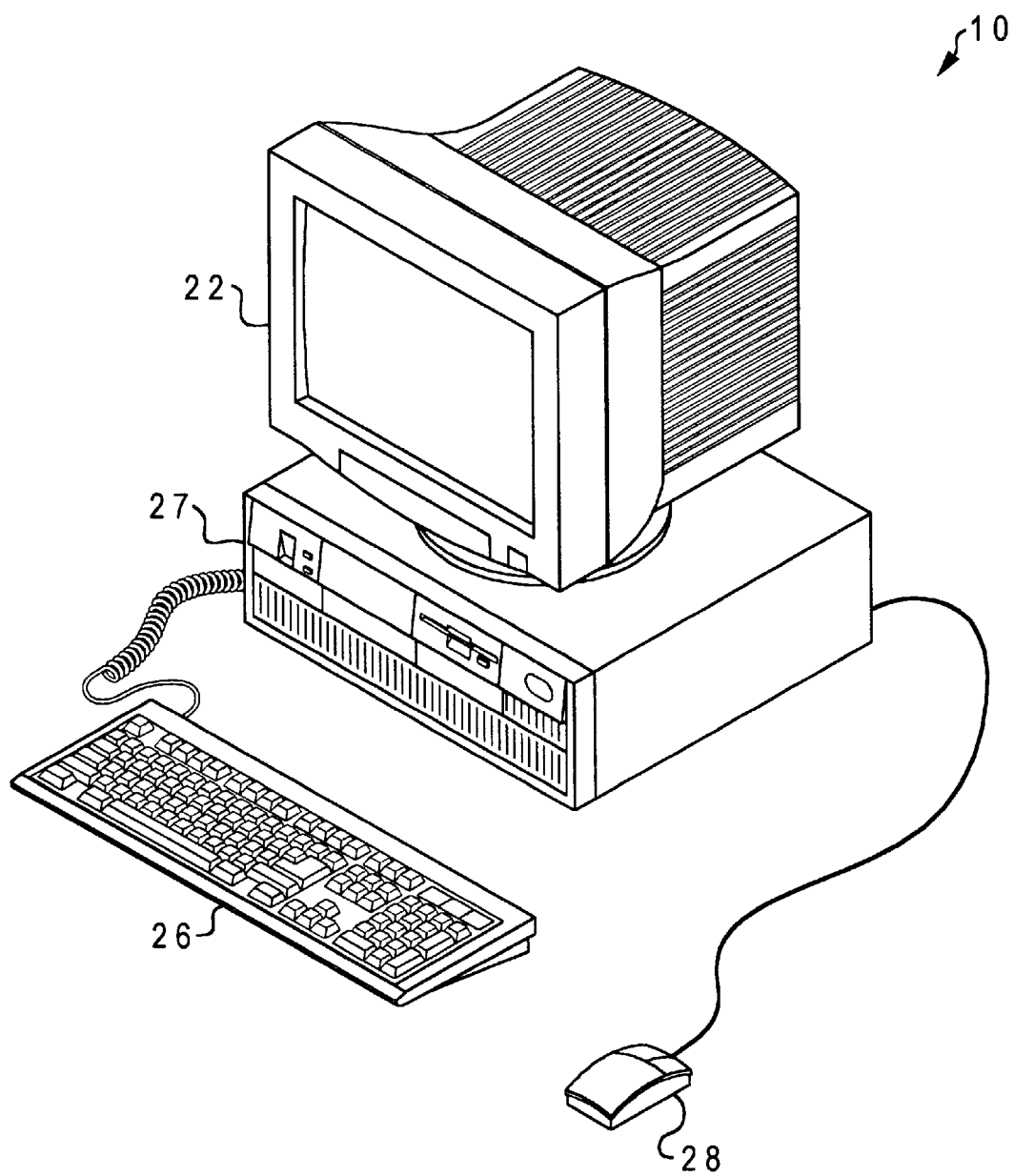
FIG. 1 is a pictorial view of an optoelectric computer system to which a preferred embodiment of the present invention is applicable.
Figure 2:
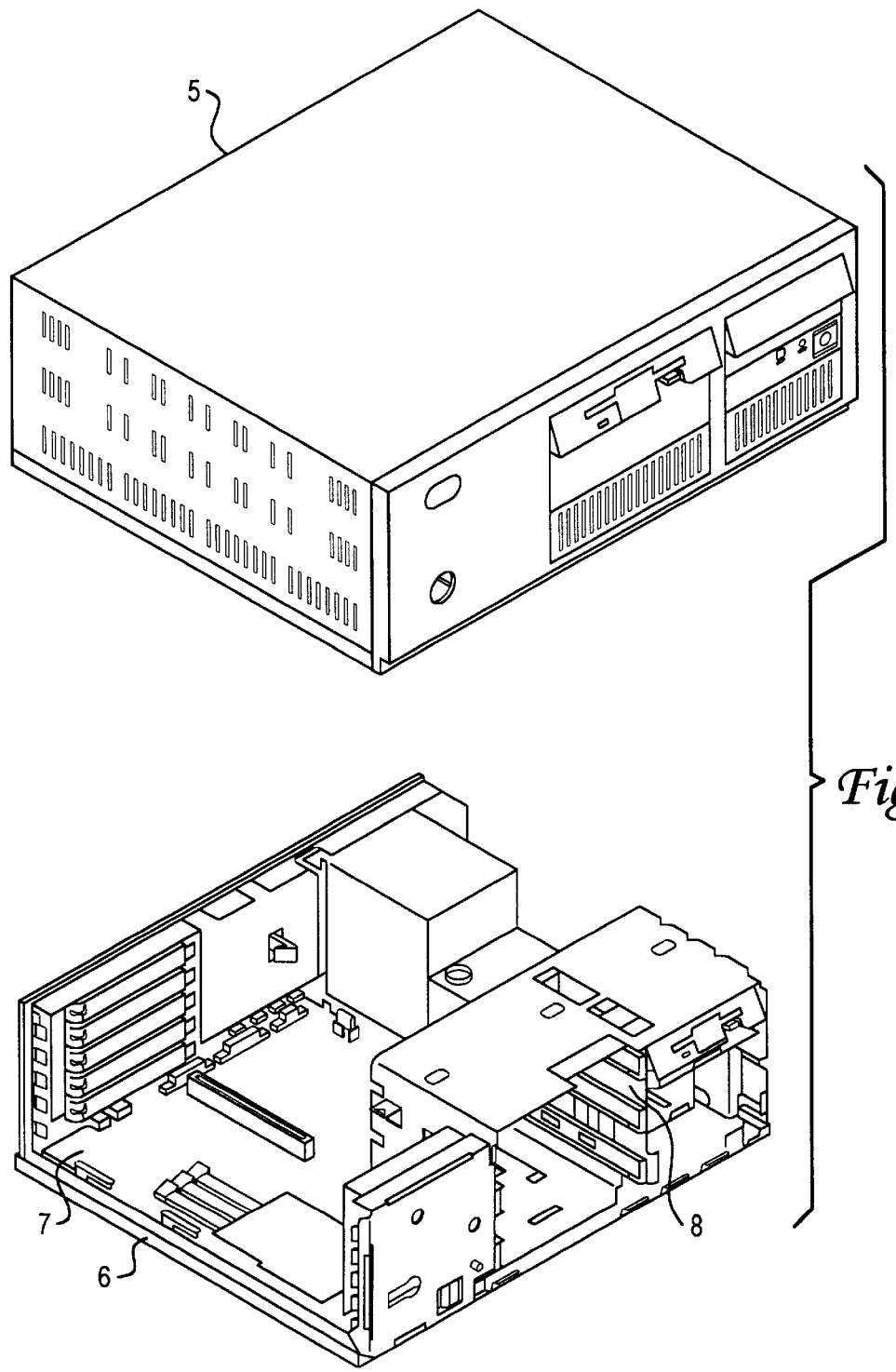
FIG. 2 is an exploded perspective view of various elements within the optoelectric computer system from FIG. 1.

Referring now to the drawings and in particular to FIG. 1, there is depicted a block diagram of an optoelectric computer system to which a preferred embodiment of the present invention is applicable. An optoelectric computer system 10 includes a computer unit 27, a monitor 22, a keyboard 26, and a mouse 28. As shown in FIG. 2, computer unit 27 has a cover 5 that cooperates with a chassis 6 in defining an enclosed, shielded volume for receiving electrically powered data processing components. Some of the data processing components are mounted on a printed circuit board (or motherboard) 7 that is secured within chassis 6. Chassis 6 has a base and a rear panel and defines at least one open bay for receiving a data storage device such as a magnetic disk drive, an optical disk drive, or the like. As shown, an upper bay 8 is adapted to receive a floppy disk drive (not shown).

Figure 3:
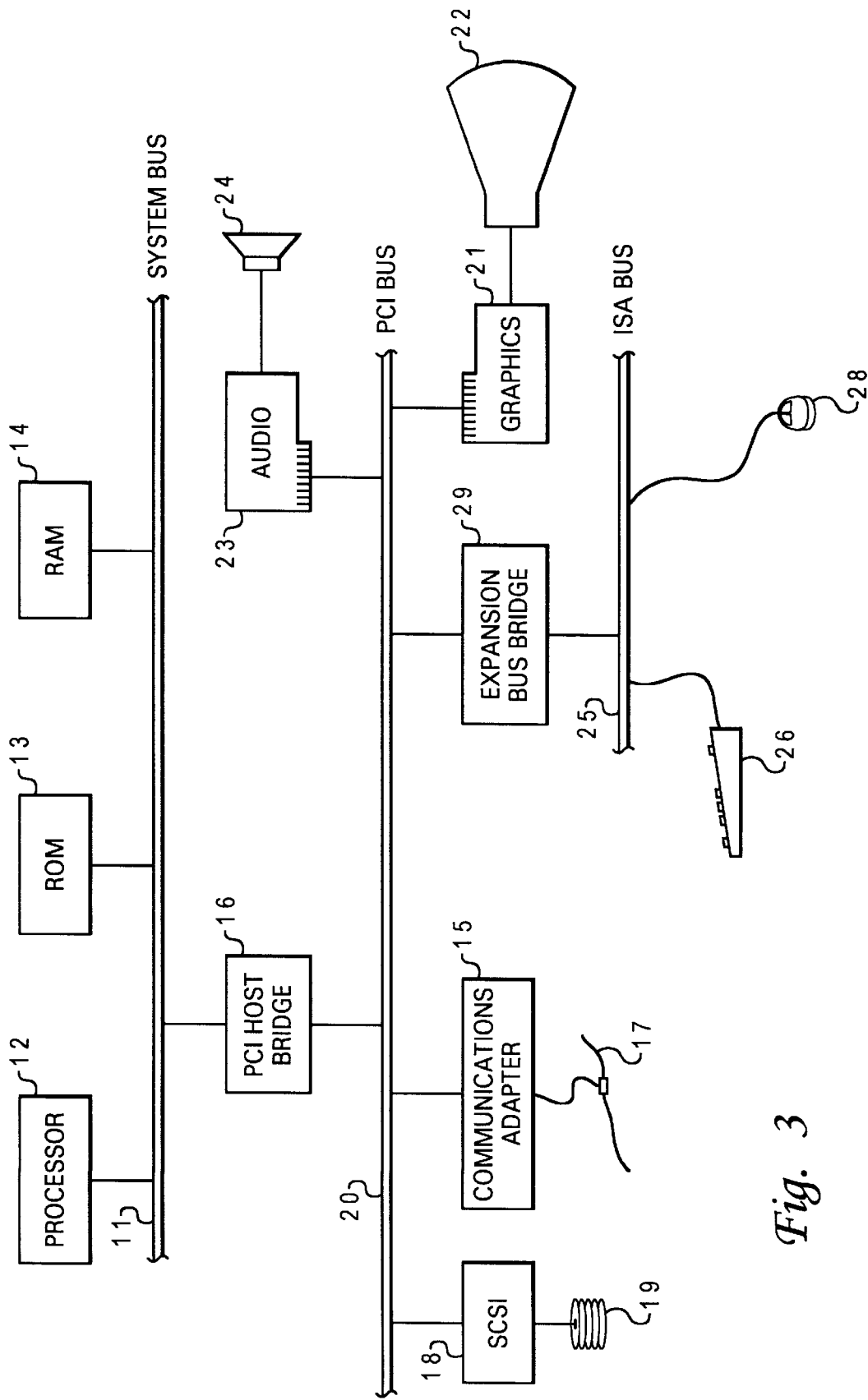
FIG. 3 is a block diagram of various elements of the optoelectric computer system from FIG. 1.

Referring now to FIG. 3, there is illustrated a block diagram of various components within optoelectric computer system 10, including components mounted on printed circuit board 7 and the connection of printed circuit board 7 to the I/O slots. As shown, a processor 12, a read-only memory (ROM) 13, and a Random Access Memory (RAM) 14 are connected to a system bus 11. Processor 12, ROM 13, and RAM 14 are also coupled to a PCI bus 20 of optoelectric computer system 10 through a PCI host bridge 16. PCI host bridge 16 provides a low latency path through which processor 12 may directly access PCI devices mapped anywhere within bus memory and/or I/O address spaces. PCI host bridge 16 also provides a high bandwidth path allowing PCI devices to directly access RAM 14.

Also attached to PCI bus 20 is a communications adapter 15 and a small computer system interface (SCSI) 18. Communications adapter 17 connects optoelectric computer system 10 to a local-area network (LAN) 17. SCSI 18 is utilized to control a high-speed SCSI disk drive 19. Expansion bus bridge 29, such as a PCI-to-ISA bus bridge, may be utilized for coupling an ISA bus 25 to PCI bus 20. As shown, keyboard 26 and mouse 28 are attached to ISA bus 25 for performing certain basic I/O functions. In addition, an audio adapter 23 and a graphics adapter 21 may be attached to PCI bus 20. Graphics adapter 21 controls visual output through monitor 22 and audio adapter 23 controls audio output through a speaker 24.

Figure 4:
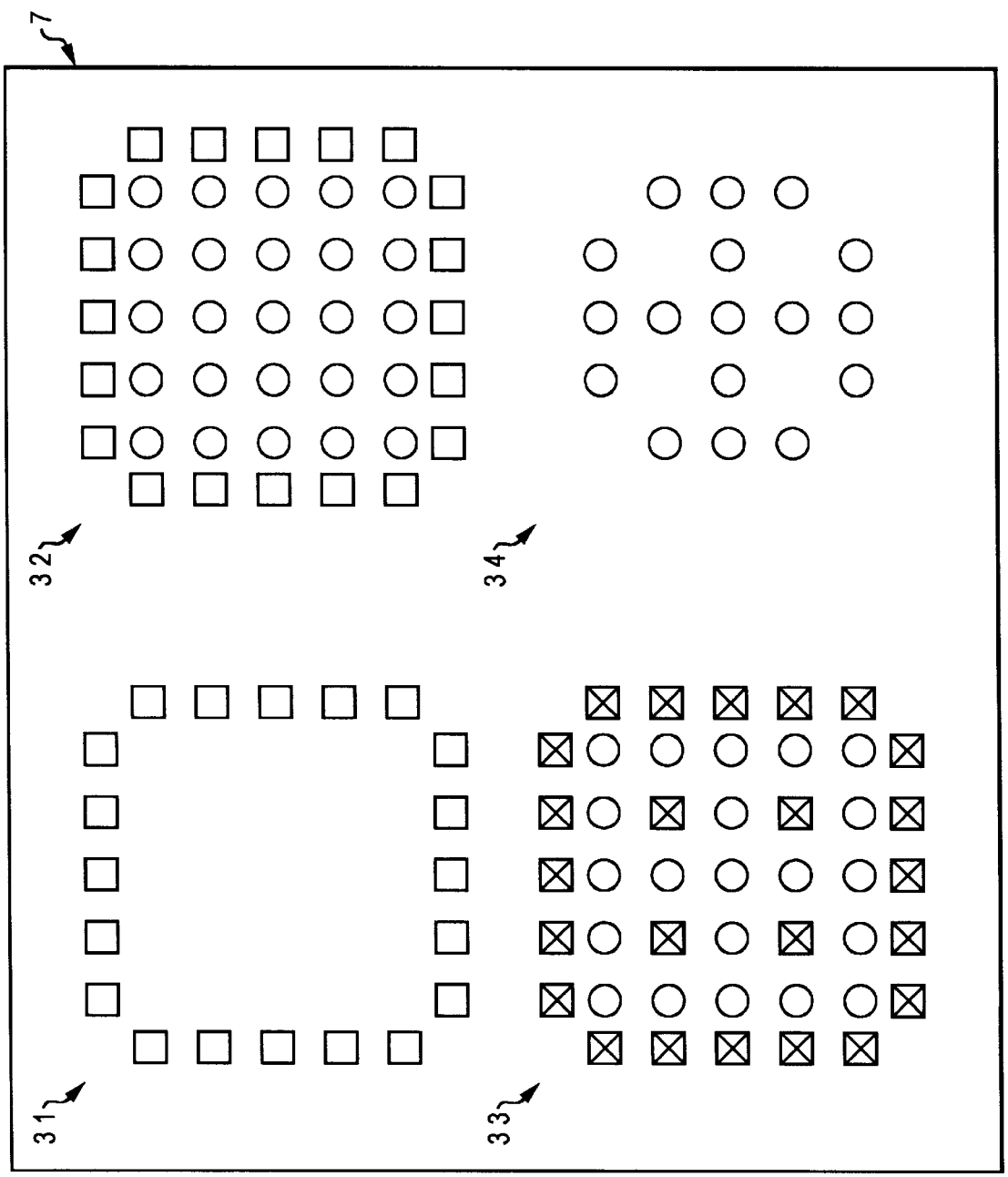
FIG. 4 is a plan view of a printed circuit board used in the optoelectric computer system from FIG. 1.

With reference now to FIG. 4, there is illustrated a top plan view of printed circuit board 7 used in optoelectric computer system 10 of FIG. 1, in accordance with a preferred embodiment of the present invention. For the purpose of illustration, there are only four mounting sites—mounting sites 31–34—included on printed circuit board 7. Each of mounting sites 31–34 is designed to receive a different type of electronic or optoelectric devices. In FIG. 4, each square represents an electrically conductive site located on the surface of printed circuit board 7, each square having an "x" represents an electrically conductive via on printed circuit board 7, and each circle represents an optical pathway terminated at the surface of printed circuit board 7. As shown, mounting site 31 is designed to receive a standard surface mounted electronic device. Each square is a location where a J-lead of a surface mounted electronic device can be connected to printed circuit board 7. All of mounting sites 32, 33, and 34 are designed to receive an optoelectric device. Mounting site 32 is designed to receive a surface mounted optoelectric device having optical pathways in the bottom surface and surface mounted electrical connections on the edges of the device. Mounting site 33 is designed to receive an optoelectric device having both optical pathways and electrical pin connections at the bottom surface of the device. Mounting site 34 is intended for a surface mounted optoelectric device having only optical pathways located at the bottom surface of the device, and the surface mounted optoelectric device can be secured to printed circuit board 7 by a conventional adhesive.

Generally speaking, there is typically little difficulty in aligning a surface mounted optoelectric device on a mounting site having electrical connections, such as mounting sites 32 and 33, during an assembly process. This is because the electrical connections, such as electrically connective vias at mounting site 33, aid in verifying registration between the surface mounted optoelectric device and the mounting site. However, for mounting sites that do not have electrical connections, such as mounting site 34, it is important to ensure that a surface mounted optoelectric device can be sufficiently aligned with the optical pathways during the assembly process in order to provide proper operation of the optoelectric computer system.

Figure 5B:
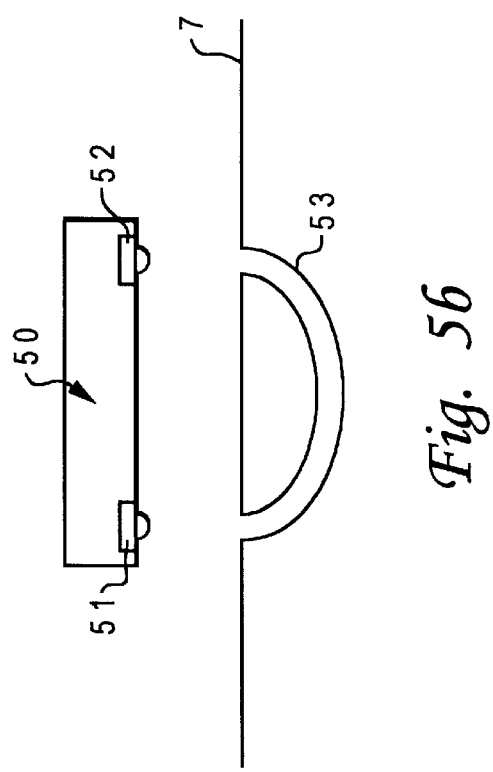
FIGS. 5a and 5b depict an apparatus for aligning surface mounted optoelectric devices on the printed circuit board from FIG. 4, in accordance with a preferred embodiment of the present invention.
Figure 5A:
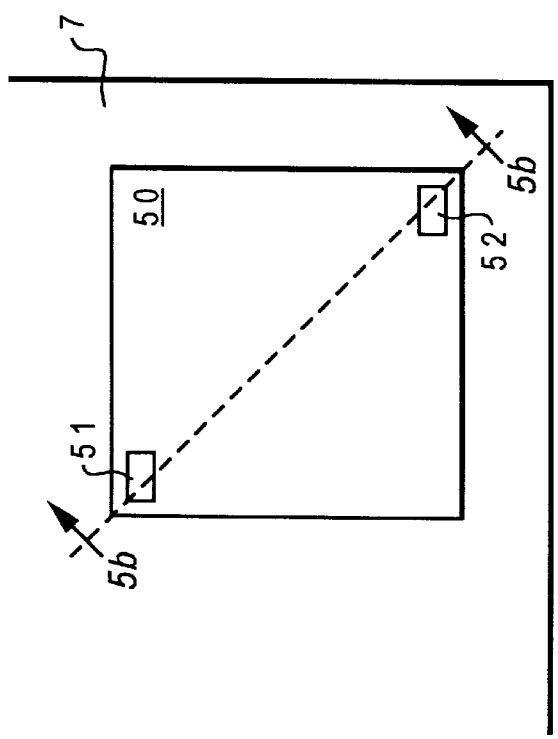

Referring now to FIGS. 5a and 5b, there are illustrated an apparatus for aligning surface mounted optoelectric devices on printed circuit board 7, in accordance with a preferred embodiment of the present invention. A top view of a surface mounted optoelectric device 50 located above printed circuit board 7 is depicted in FIG. 5a, and a cross-section view of both surface mounted optoelectric device 50 and printed circuit board 7 along line b—b in FIG. 5a is depicted in FIG. 5b. As shown, an optical transmitter 51 and an optical receiver 52 are placed at diagonal corners of surface mounted optoelectric device 50. In addition, a fiber optic cable 53 is embedded within printed circuit board 7. Fiber optic cable 53 is preferably terminated at the surface of printed circuit board 7. The end portion of fiber optic cable 53 terminating at the surface of printed circuit board 7 may have a large diameter than the body of fiber optic cable 53. In other words, the end portion of fiber optic cable 53 shapes like a funnel.

During the assembly process when surface mounted optoelectric device 50 is being placed on printed circuit board 7, both optical transmitter 51 and optical receiver 52 are powered and turned on by a surface mounted device handler (not shown) or something of the like such that optical transmitter 51 is capable of sending an optical signal and optical receiver 52 is capable of receiving the optical signal sent by optical transmitter 51.

In the present embodiment, after surface mounted optoelectric device 50 has been placed on printed circuit board 7, optical receiver 52 should be able to receive the optical signal sent by optical transmitter 51 via fiber optic cable 53 when the intended alignment of surface mounted optoelectric device 50 on printed circuit board 7 is proper. Otherwise, optical receiver 52 would receive minimal or no optical from optical transmitter 51, which indicates that there is a misalignment between surface mounted optoelectric device 50 and printed circuit board 7. Thus, along with fiber optic cable 53, both optical transmitter 51 and optical receiver 52 provide alignment feedback for the placement of surface mounted optoelectric device 50 on printed circuit board 7 during the assembly process.

As has been described, the present invention provides a method and apparatus for aligning surface mounted optoelectric devices on a printed circuit board. In order to achieve optimal alignment, at least a pair of optical transmitter and optical receiver should be placed at two opposite corners of a surface mounted optoelectric device, as shown in FIG. 5a. However, it is more preferable to have two optical transmitter and receiver pairs placed at opposing corners of the surface mounted optoelectric device.

When all four corners are being sensed, it is noted that instead of trying to maximizing one of the two pairs of optical transmitter and receiver, the total signal strength from both pairs of optical transmitter and receiver should be maximized. This goal may be achieved by a slight misalignment of the both pairs of optical transmitter and receiver. In other words, rather than precisely aligning the locations of both optical transmitter/receiver pairs, a slight "intentional" diagonal misalignment in the placement of the surface mounted optoelectric device would attain optimal alignment.

While the invention has been particularly shown and described with reference to a preferred embodiment, it will be understood by those skilled in the art that various changes in form and detail may be made therein without departing from the spirit and scope of the invention.

What is claimed is:

1. A method for aligning a surface mounted optoelectric device on a printed circuit board, said method comprising the steps of:

adding an optical transmitter and an optical receiver to a surface mounted optoelectric device;

embedding a fiber optic cable within a printed circuit board, wherein a first end and a second end of said fiber optic cable are embedded in said printed circuit board, wherein said fiber optic cable having a length at least equivalent to a distance between said optical transmitter and said optical receiver placed on said surface mounted optoelectric device; and aligning an orientation of said surface mounted optoelectric device on said printed circuit board such that an optical signal transmitting from said optical transmitter at said first end of said fiber optic cable can be received by said optical receiver at said second end of said fiber optic cable.

2. The method according to claim 1, wherein said adding step further includes a step of adding said optical transmitter and said optical receiver at opposite corners of said surface mounted optoelectric device.

3. The method according to claim 1, wherein said fiber optic cable terminates at a surface of said printed circuit board.

4. The method according to claim 1, wherein said method further includes steps of:

adding a second optical transmitter and a second optical receiver to said surface mounted optoelectric device; and embedding a second fiber optic cable within said printed circuit board, wherein said second fiber optic cable having a length at least equivalent to a distance between said second optical transmitter and said optical receiver placed on said second surface mounted optoelectric device.

5. The method according to claim 4, wherein said step of adding a second optical transmitter and a second optical receiver further includes a step of adding said second optical transmitter and said second optical receiver at opposite corners of said surface mounted optoelectric device.

6. The method according to claim 4, wherein said second fiber optic cable terminates at a surface of said printed circuit board.

7. An apparatus for aligning a surface mounted optoelectric device on a printed circuit board, said apparatus comprising:

an optical transmitter and an optical receiver located on a surface mounted optoelectric device;

a fiber optic cable embedded within a printed circuit board, wherein a first end and a second end of said fiber optic cable are embedded in said printed circuit board, wherein said fiber optic cable having a length at least equivalent to a distance between said optical transmitter and said optical receiver placed on said surface mounted optoelectric device; and means for aligning an orientation of said surface mounted optoelectric device on said printed circuit board such that an optical signal transmitting from said optical transmitter at said first end of said fiber optic cable can be received by said optical receiver at said second end of said fiber optic cable.

8. The apparatus according to claim 7, wherein said optical transmitter and said optical receiver are placed on opposite corners of said surface mounted optoelectric device.

9. The apparatus according to claim 7, wherein said fiber optic cable terminates at a surface of said printed circuit board.

10. The apparatus according to claim 7, wherein said apparatus further includes:

a second optical transmitter and a second optical receiver placed on said surface mounted optoelectric device; and a second fiber optic cable embedded within said printed circuit board, wherein said second fiber optic cable having a length at least equivalent to a distance between said second optical transmitter and said optical receiver placed on said second surface mounted optoelectric device.

11. The apparatus according to claim 10, wherein said second optical transmitter and said second optical receiver are placed on opposite corners of said surface mounted optoelectric device.

12. The apparatus according to claim 10, wherein said second fiber optic cable terminates at a surface of said printed circuit board.

* * * * *